United States Patent [19]

Tokumaru et al.

[11] Patent Number: 5,473,425
[45] Date of Patent: Dec. 5, 1995

[54] IC PACKAGE INSPECTION APPARATUS

[75] Inventors: Tomohide Tokumaru; Tetsuo Abe; Morio Misono, all of Kanagawa, Japan

[73] Assignee: Sony Corporation, Tokyo, Japan

[21] Appl. No.: 327,713

[22] Filed: Oct. 24, 1994

[30] Foreign Application Priority Data

Oct. 29, 1993 [JP] Japan ................................ 5-293999

[51] Int. Cl.$^6$ .................................................. H01L 21/66
[52] U.S. Cl. .......................................... 356/237; 356/240
[58] Field of Search ................................ 356/237, 240, 356/394, 426, 427, 429, 430; 250/559.34, 559.46; 382/141, 145, 146; 348/86, 87, 88, 92

[56] References Cited

U.S. PATENT DOCUMENTS

| | | | |
|---|---|---|---|
| 3,757,943 | 9/1973 | Chae et al. | 356/427 |
| 4,136,930 | 1/1979 | Gomm et al. | 356/240 |
| 4,912,318 | 3/1990 | Kajiura et al. | 356/240 |

*Primary Examiner*—Richard A. Rosenberger
*Attorney, Agent, or Firm*—Hill, Steadman & Simpson

[57] ABSTRACT

An apparatus for inspecting the outward appearance of each of IC packages stored in an embossed tape includes a drive wheel having an outer periphery about which the embossed tape is wound. The drive wheel is rotatable in a vertical plane for moving the embossed tape. A pair of cameras are so mounted as to face the outer periphery of the drive wheel at its upwardly and downwardly moving portions, respectively, and are used to produce two different images of each IC package from two different angles through a cover tape bonded to the embossed tape for enclosing the IC packages. The apparatus prevents any diffused reflection of light by the cover tape and any inclination of each IC package during its inspection.

7 Claims, 6 Drawing Sheets

(related art)

(Inclination)

(related art)

IC PACKAGE INSPECTION APPARATUS

BACKGROUND OF THE INVENTION

1. Field of the invention

This invention relates to an apparatus for inspecting the outward appearance of an IC package stored in an embossed tape.

2. Description of the Related Art

The IC package made by a series of manufacturing steps are usually stored in an embossed tape employed as means for parts supply to e.g. an automounter, so that they may be picked up by the mounter head, and mounted on a wiring board. No proper mounting is, however, possible if any IC package stored in the embossed tape faces in the wrong direction, if any pin position is wrongly marked, if the embossed tape contains a different kind of IC package, or if any lead is bent, or undesirably floated or sunk. It is, therefore, necessary to inspect the outward appearance of any IC package stored in an embossed tape before its shipment.

FIG. 1 shows a known apparatus for inspecting the outward appearance of IC packages. The apparatus includes a mechanism not shown, but provided for moving an embossed tape 10, which is unwound from a reel not shown, intermittently by a predetermined distance in one direction as indicated by an arrow pointing to the left in FIG. 1, and an image forming camera 1 facing the embossed tape 10. The embossed tape 10 stores a plurality of IC packages P enclosed by a cover tape 2. As the embossed tape 10 is intermittently moved, the image of each package P is taken by the camera 1 through the cover tape 2, and used for the inspection of its outward appearance.

The known apparatus has, however, a number of drawbacks as pointed out below:

(1) If the cover tape 2 becomes loose, it causes the diffused reflection of light from a light source on its surface as shown by hatching in FIG. 2, and the hatched portions appear white in an image taken by the camera and disable the configuration of an IC package P to be clearly recognized;

(2) The position of any IC package P in the monitor area of the camera 1 is so unstable that, if, for example, vibration causes the package P to be inclined in the storage concavity 10a of the embossed tape 10 as shown in FIG. 2, a character string to be read from the position of a mark M as representing the type and kind of the package P disappears from the read area of the camera 1, resulting in the failure to identify the package P; and (3) The sidewalls W of each storage concavity 10a of the embossed tape 10 are inclined for the convenience of its release from a device employed for making it, and if the inclination of any IC package P brings the free ends of its lead or leads L into contact with the sidewalls W, the virtual images of the leads L are formed on the sidewalls W as shown in FIG. 3, and make it impossible to inspect the leads L properly to see if they are bent, or raised or depressed. When a lead appears long, it normally means that the lead is floating. In this situation, conventional recognition systems judge it to be a defective lead, even though it is a good lead.

OBJECT AND SUMMARY OF THE INVENTION

Under these circumstances, it is an object of this invention to provide an apparatus which can inspect the outward appearance of any IC package in an embossed tape without being affected by the diffused reflection of light on its cover tape or the inclination of the IC package.

This object is attained by an apparatus for inspecting the outward appearance of an IC package stored in an embossed tape by inspecting its image formed through a cover tape bonded to the embossed tape, which apparatus comprises a drive wheel having an outer periphery about which the embossed tape is wound, the drive wheel being rotatable in a vertical plane for moving the embossed tape, and a pair of image forming cameras facing the outer periphery of the drive wheel at its upwardly and downwardly moving portions, respectively.

The above object is also attained by an apparatus which comprises a pair of drive wheels each having an outer periphery about which an embossed tape extending from one of the drive wheels to the other is wound, the drive wheels being rotatable in planes inclined in opposite directions to the vertical, respectively, for moving the embossed tape, and a pair of image forming cameras facing the outer periphery of one of the drive wheels at its upwardly moving portion and the outer periphery of the other drive wheel at its downwardly moving portion, respectively.

The drive wheel (or wheels) stretches the embossed tape effectively and prevents it from becoming loose and causing any diffused reflection of light. The cameras can, therefore, form a complete image of any IC package which enables its entire configuration to be clearly recognized. As the IC package to be inspected is displaced in the opposite directions within the storage concavity of the embossed tape when it stays on the upwardly and downwardly moving portions, respectively, of the outer periphery of the drive wheel, there is no inclination of the IC package, while a proper clearance is kept between its leads and the sidewalls of the storage concavity. The apparatus, therefore, ensures the identification of any IC package by reading a character string from the position of its mark, and also the correct inspection of any lead without having any virtual image thereof formed.

If the apparatus has a pair of drive wheels inclined in the opposite directions to the vertical, the IC package to be inspected is displaced toward the diagonally opposite corners of the storage concavity when it stays on the upwardly moving portion of the outer periphery of one of the drive wheels and on the downwardly moving portion of the outer periphery of the other drive wheel, respectively. Thus, the apparatus can effectively inspect even a QFP tape IC package without allowing its inclination, or having any lead contact the sidewall of the storage concavity.

Other features and advantages of this invention will become apparent from the following description and the accompanying drawings.

BRIEF DESCRIPTION OF THE DRAWINGS

FIG. 6b is a top plan view of the IC package and embossed tape shown in FIG. 6a;

DESCRIPTION OF THE PREFERRED EMBODIMENTS

The invention will now be described in detail with reference to the drawings showing a couple of preferred embodiments thereof. Reference is first made to FIGS. 4 to 6d showing an apparatus for inspecting the outward appearance of an IC package as a first embodiment of this invention.

Figure 1:
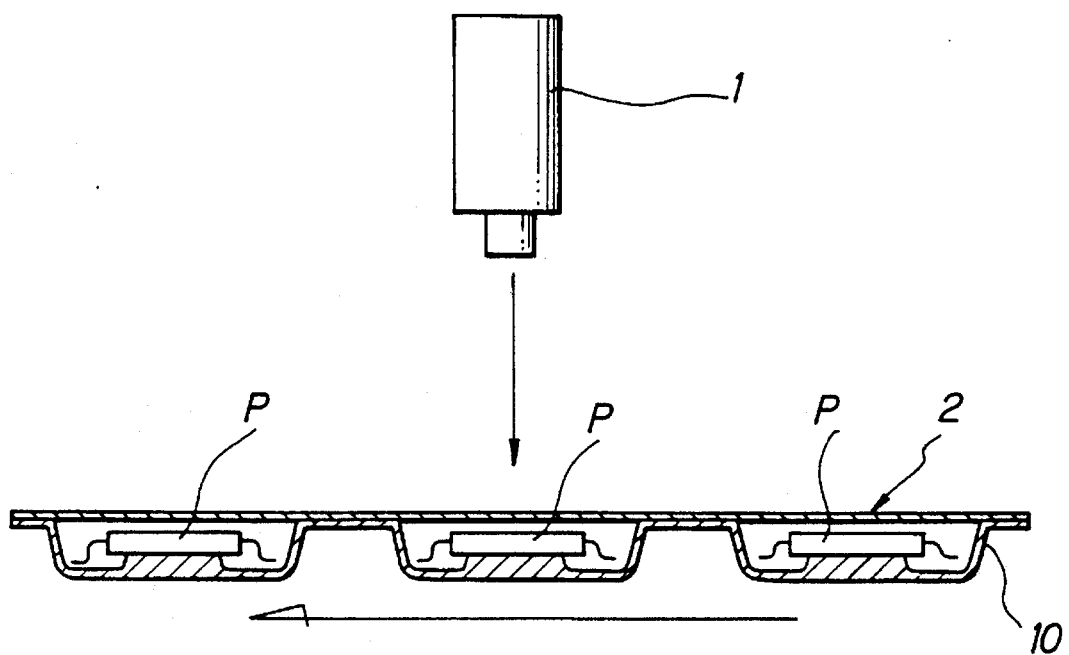
FIG. 1 is a side elevational and partly sectional view illustrating the inspection of an IC package in an embossed tape by a known apparatus.
Figure 2:
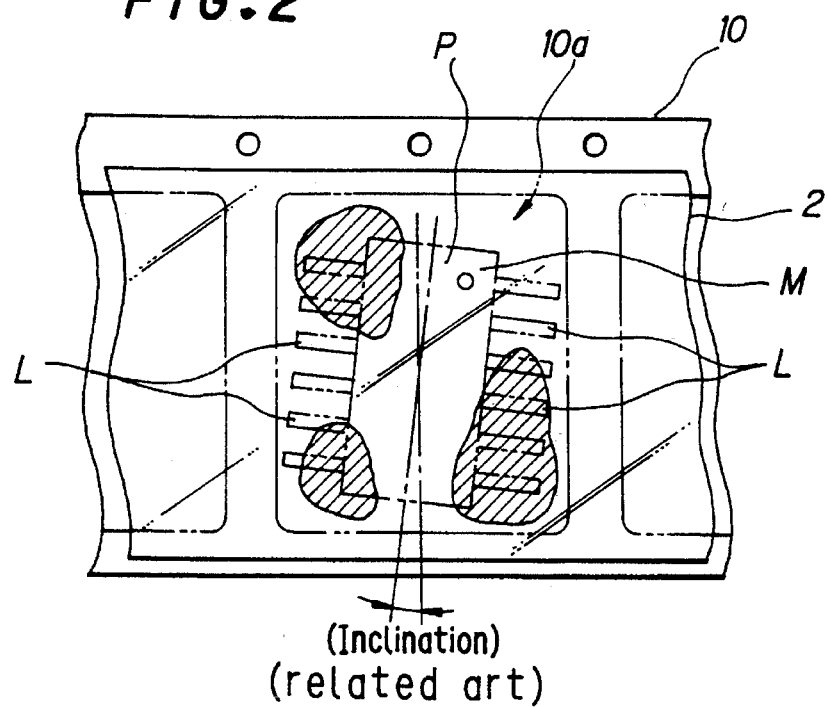
FIG. 2 is a fragmentary top plan view of the embossed tape showing a drawback of the known apparatus.
Figure 3:
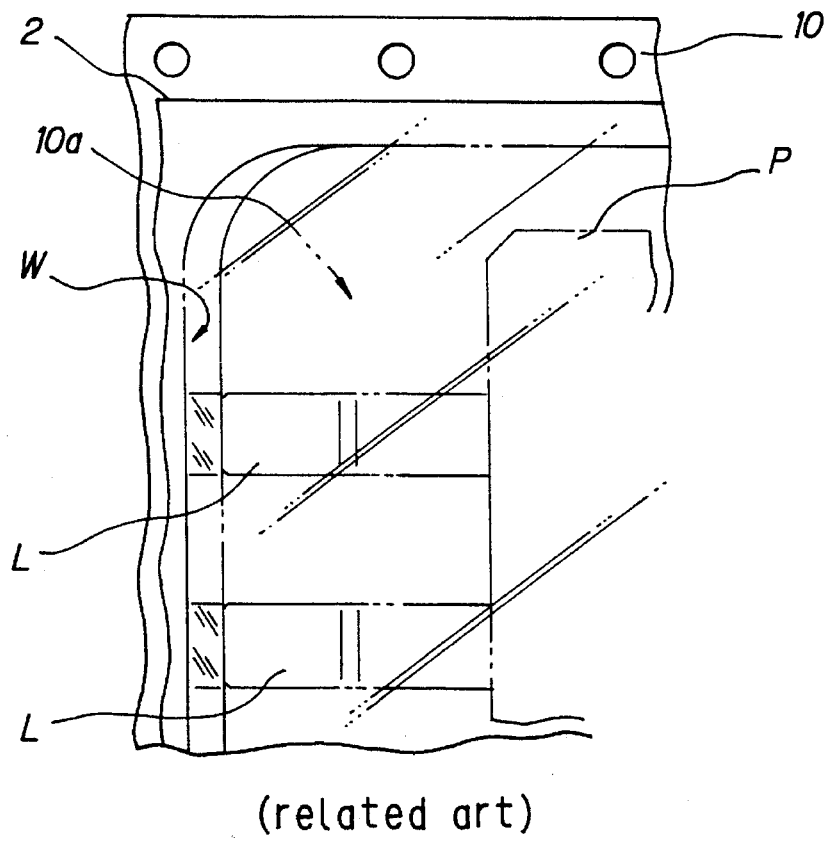
FIG. 3 is a view similar to FIG. 2, but showing another drawback of the known apparatus.
Figure 4:
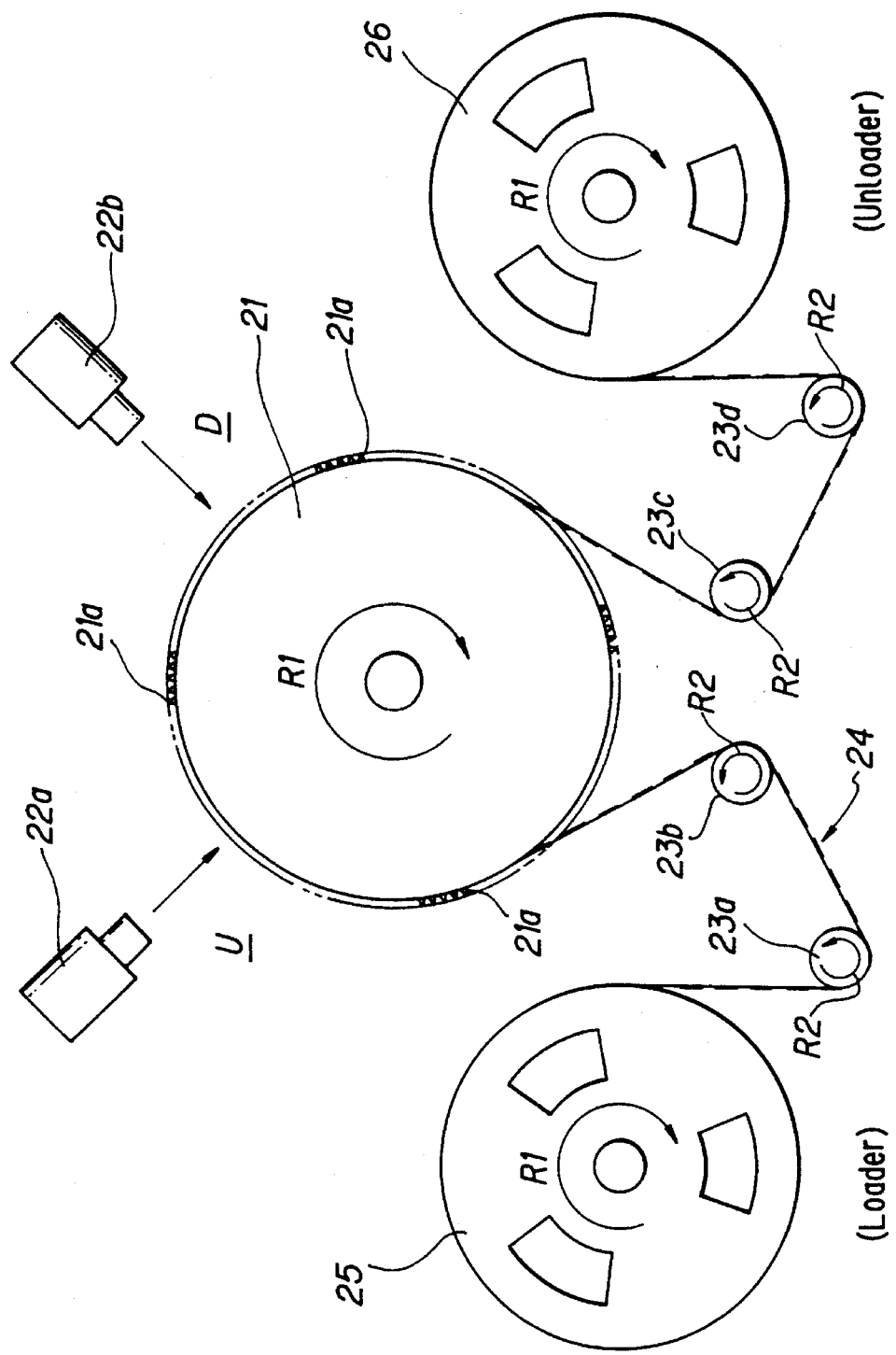
FIG. 4 is a schematic side elevational view of an apparatus according to a first embodiment of this invention.

The apparatus comprises a drive wheel 21, a pair of image forming cameras 22a and 22b, and four guide rollers 23a to 23d, as shown in FIG. 4. The apparatus is also provided with a supply reel 25 for an embossed tape 24 as a loader and a takeup reel 26 therefor as an unloader.

The drive wheel 21 is driven by, for example, a drive motor not shown, and is rotatable in a vertical plane in the direction of an arrow R1. The drive wheel 21 has a multiplicity of sprocket pins 21a formed in a line along its outer periphery, and the embossed tape 24 has a line of sprocket holes 24a (FIG. 6b or 6d) in which the pins 21a are engageable when the embossed tape 24 is wound about the outer periphery of the drive wheel 21.

The cameras 22a and 22b may each be an industrial television camera, and are each used for producing an image of an IC package in the embossed tape 24 through a cover tape 27 (FIG. 5 or 6a to 6d) bonded to the embossed tape 24. One of the cameras, 22a ia directed toward the upwardly moving portion U of the outer periphery of the drive wheel 21, and the other camera 22b toward its downwardly moving portion D.

Two of the guide rollers, 23a and 23b, are located near the loader, and the other two guide rollers 23c and 23d near the unloader. The guide rollers 23a and 23b form a path for the movement of the embossed tape 24 between the supply reel 25 and the drive wheel 21, while the guide rollers 23c and 23d form a path for the movement of the embossed tape 24 between the drive wheel 21 and the takeup reel 26.

Before the operation of the apparatus is started, the supply reel 25 containing the embossed tape 24 to be inspected is mounted in the loader, while the takeup reel 26 mounted in the unloader is empty. The embossed tape 24 is unwound from the supply reel 25, passed around the guide rollers 23a and 23b, and wound about the outer periphery of the drive wheel 21. The embossed tape 24 is further unwound, and passed around the guide rollers 23c and 23d until its leading end is fastened to the takeup reel 26. It is important to ensure that the sprocket pins 21a on the drive wheel 21 be engaged in the sprocket holes 24a of the embossed tape 24. The embossed tape 24 has an empty portion terminating at its leading end, and storing no IC package at all, so that the first IC package stored in the embossed tape 24, though not shown, may be located between the loader and the monitor area of the first camera 22a when the leading end of the embossed tape 24 is fastened to the takeup reel 26.

The drive motor not shown is operated for rotating the drive wheel 21 in the direction of the arrow R1 to move the embossed tape 24 until the first IC package not shown is positioned within the monitor area of the first camera 22a. The rotation of the drive wheel 21 causes the rotation of each of the supply and takeup reels 25 and 26 in the direction of an arrow R1, and of each of the guide rollers 23a to 23d in the direction of an arrow R2, as shown in FIG. 4.

An image of the first IC package is produced by the camera 22a, and after its appropriate treatment, it is employed for the inspection of the package in outward appearance. The dive wheel 21 is intermittently rotated, so that each rotation thereof may cause the movement of the embossed tape 24 by a distance equal to the distance between every two adjoining IC packages stored therein, and so that the camera 22a may form images of the packages one after another.

As the drive wheel 21 is further rotated, the first IC package arrives in the monitor area of the second camera 22b and an image thereof is produced again by the second camera 22b, and after its appropriate treatment, it is used for the inspection of the package in outward appearance. This operation is repeated on all the other IC packages arriving one after another until an image of the last IC package is produced by the second camera 22b. The embossed tape 24 is, then, wound completely on the takeup reel 26.

Figure 5A:
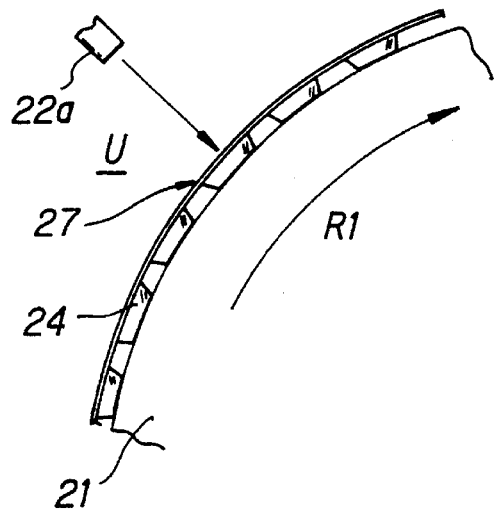
FIGS. 5a and 5b are fragmentary enlarged view of a drive wheel in the apparatus of FIG. 4 and an embossed tape wound on it.
Figure 5B:
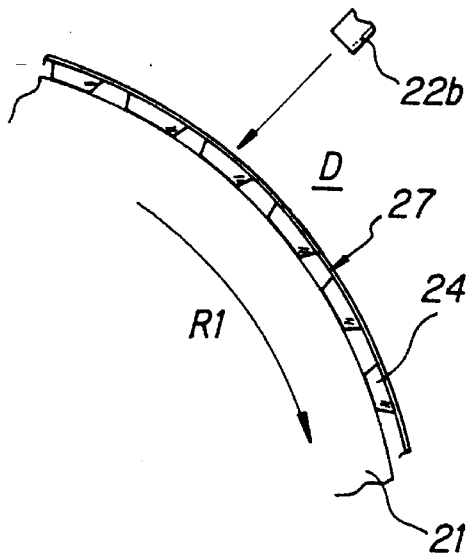

Insofar as the embossed tape 24 is wound about the drive wheel 21, the cover tape 27 is sufficiently stretched on both of the upwardly and downwardly moving portions U and D of the drive wheel 21, as shown in FIG. 5, not to become loose and cause any diffused reflection of light when the images of any IC package are produced by the cameras 22a and 22b.

Figure 6A:
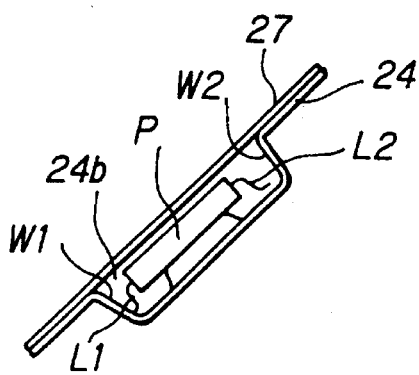
FIG. 6a is an enlarged view of one of IC packages in the embossed tape shown in the left half of FIG. 5.
Figure 6C:
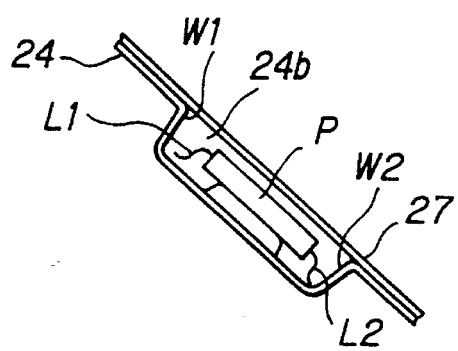
FIG. 6c is an enlarged view of one of IC packages in the embossed tape shown in the right half of FIG. 5.
Figure 6B:
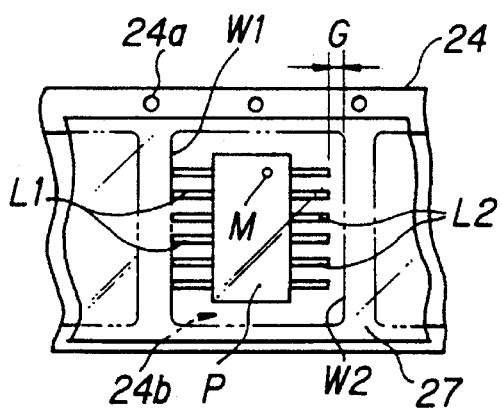

The IC package P in any storage concavity 24b of the embossed tape 24 on the upwardly moving portion U of the drive wheel 21 is displaced by its own weight toward one of a pair of opposite sidewalls, W1, of the storage concavity 24b with its leads L1 on one side thereof abutting on the sidewall W1, as shown in FIGS. 6a and 6b, while a gap G is formed between the leads L2 on the other side of the IC package P and the other sidewall W2 of the storage concavity 24b.

Figure 6D:
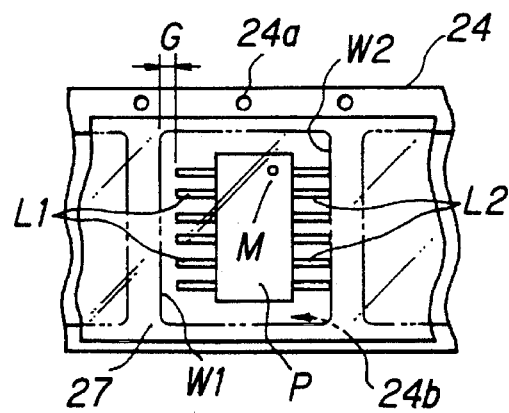
FIG. 6d is a top plan view of the IC package and embossed tape shown in FIG. 6c.

As a result of further rotation of the drive wheel 21, however, the IC package P is displaced toward the other sidewall W2 of the storage concavity 24b with its leads L2 abutting on the sidewall W2, as shown in FIGS. 6c and 6d, while a gap G is formed between the leads L1 and the sidewall W1.

In either event, the IC package P is not inclined, but maintains its proper position in the storage concavity 24b. The gap G ensures that, when an image of the IC package P is produced by the camera 22a near the upwardly moving portion U of the drive wheel 21, no virtual image of any lead L2 be formed on the sidewall W2 of the storage concavity 24b, while no virtual image of any lead L1 is formed on the sidewall L1, either, when an image of the IC package P is produced by the other camera 22b.

The cameras 22a and 22b are preferably mounted at an angle of 30° to 60° to and above a horizontal plane passing through the center of the drive wheel 21 if the stability in position of the IC package P to be inspected is taken into consideration. It is, however, possible to perform a proper inspection of any IC package P in its appropriately displaced position, while the cover tape 27 is properly stretched, even if the cameras may be mounted at an angle of 5° to 80° to the horizontal plane. In the apparatus shown in FIG. 4, the cameras 22a and 22b are mounted at an angle of about 45° to and above the horizontal plane passing through the center of the drive wheel 21.

Figure 7:
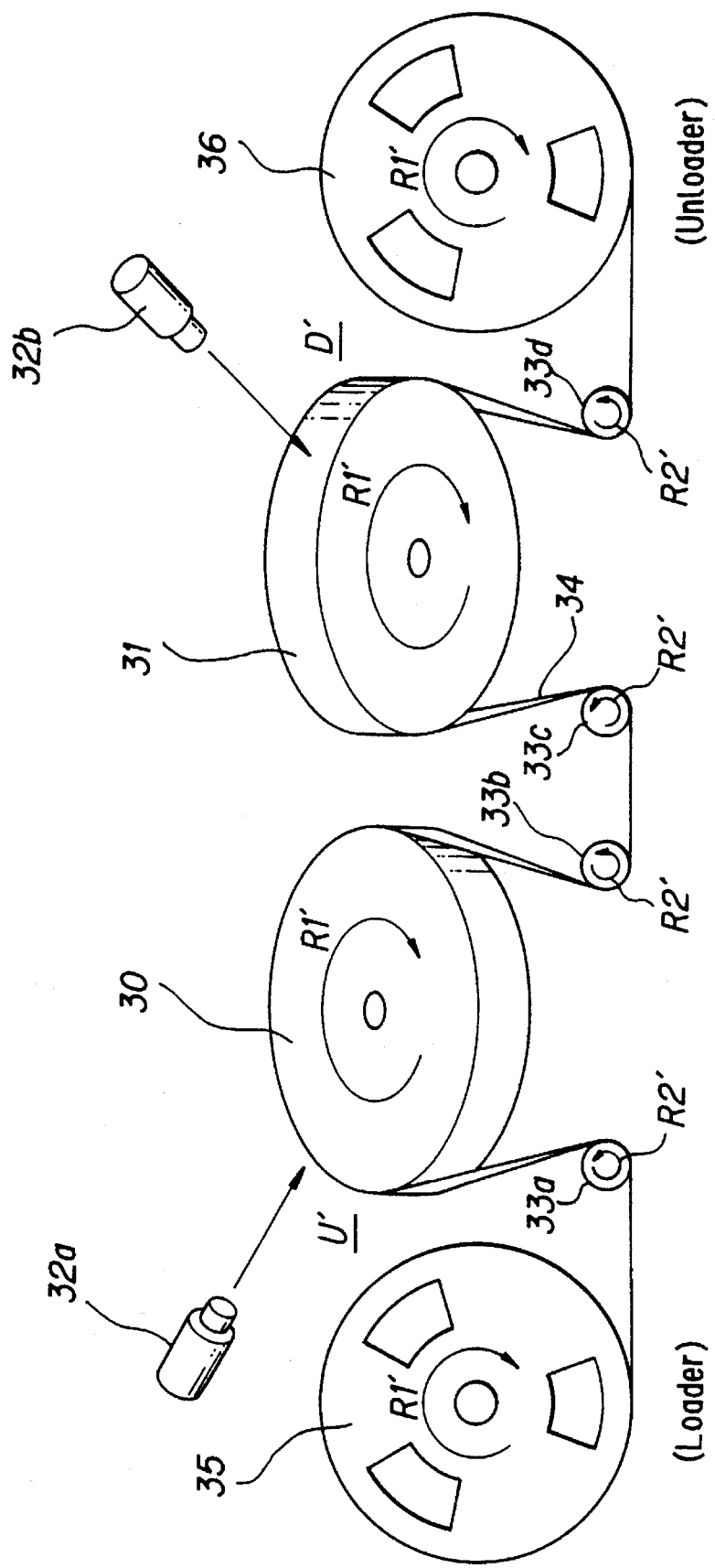
FIG. 7 is a schematic side elevational view of an apparatus according to a second embodiment of this invention.
Figure 8A:
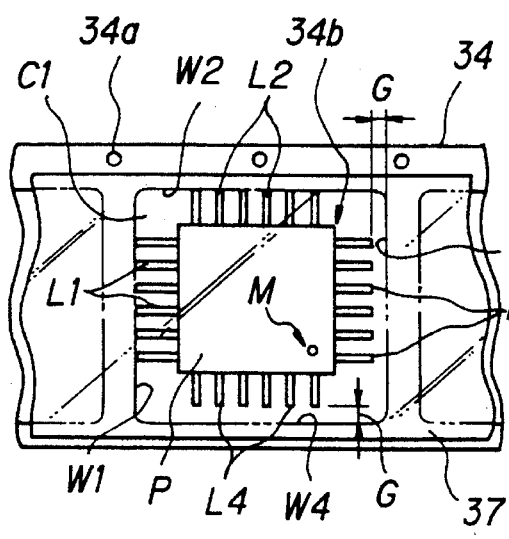
FIG. 8a is an enlarged top plan view of an embossed tape portion wound about one of two drive wheels shown in FIG. 7, and an IC package held thereon.
Figure 8B:
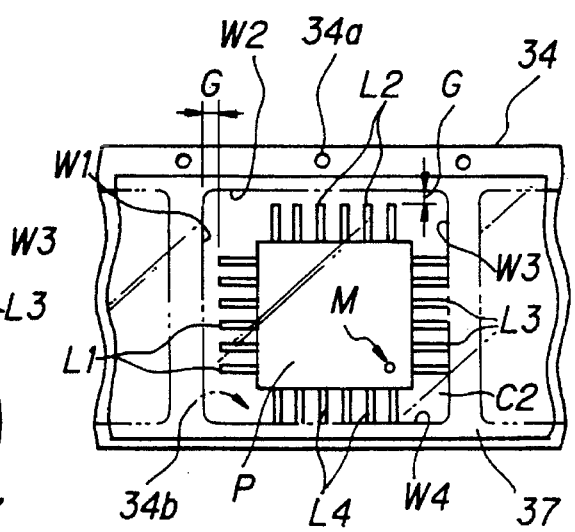
FIG. 8b is a view similar to FIG. 8a, but showing an embossed tape portion wound about the other drive wheel, and an IC package held therein.

The apparatus described above as the first embodiment of this invention is intended for the inspection of SOP (small outline package) type IC packages. Attention is now directed to FIGS. 7, 8a and 8b showing an apparatus according to a second embodiment of this invention which is intended for the inspection of QFP (quad flat package) type IC packages.

The apparatus shown in FIG. 7 comprises a pair of drive wheels 30 and 31, a pair of image forming cameras 32a and 32b, and four guide rollers 33a to 33d. It is also provided with a supply reel 35 for an embossed tape 34 as a leader and a takeup reel 36 therefor as an unloader. The drive wheels 30 and 31 are supported in planes inclined to the vertical in opposite directions, and are rotatable by, for example, a drive motor not shown. Each drive wheel has a multiplicity of sprocket pins formed on its outer periphery, though not shown, and spaced apart from one another by a distance equal to the pitch of every two adjoining sprocket holes 34a (FIG. 8a or 8b) in the embossed tape 34. The sprocket pins are engageable with the appropriate sprocket holes 34a when the embossed tape 34 is wound about the drive wheels 30 and 31.

One of the cameras, 32a, is directed toward the upwardly moving portion U' of the outer periphery of one of the drive wheels, 30, while the other camera 32b is directed toward the downwardly moving portion D' of the outer periphery of the other drive wheel 31. Each camera is used for producing an image of an IC package through a cover tape 37 (FIG. 8a or 8b) bonded to the embossed tape 34.

The guide roller 33a is located between the supply reel 35 and the drive wheel 30, the guide rollers 33b and 33c between the drive wheels 30 and 31, and the guide roller 33d between the drive wheel 31 and the takeup reel 36, so that a path for the movement of the embossed tape 34 may be formed from the supply reel 35 to the takeup reel 36 and about the drive wheels.

Before the apparatus is placed in operation, the supply reel 35 containing a full embossed tape 34 is mounted in the loader, while the takeup reel 36 mounted in the unloader is empty. The embossed tape 34 is unwound from the supply reel 35, passed around the guide roller 33a, wound about the drive wheel 30, passed around the guide rollers 33b and 33c, and wound about the drive wheel 31. The embossed tape 34 extending beyond the drive wheel 31 is passed around the guide roller 33d, and its leading end is fastened to the takeup reel 36. It is important to ensure that the appropriate sprocket pins on the drive wheels 30 and 31, though not shown, be engaged in the appropriate sprocket holes 34a of the embossed tape 34.

The embossed tape 34 has an empty portion terminating at its leading end, and not containing any IC package, so that the first IC package held therein, though not shown, may stay short of the monitor area of the first camera 32a when the leading end of the embossed tape 34 is fastened to the takeup reel 36.

The drive motor not shown is operated to rotate the drive wheels 30 and 31 together in the direction of an arrow R1' to move the embossed tape 34 until the first IC package is positioned within the monitor area of the first camera 32a.

The rotation of the drive wheels 30 and 31 causes the rotation of the supply and takeup reels 35 and 36 in the direction of an arrow R1', and of the guide rollers 33a to 33d in the direction of an arrow R2', as shown in FIG. 7.

An image of the first IC package is produced by the camera 32a, and after its appropriate processing, it is employed for the inspection of the package in outward appearance. The drive wheels 30 and 31 are intermittently rotated, so that each rotation thereof may cause the movement of the embossed tape 34 by a distance equal to the distance between every two adjoining IC packages stored therein, and so that the camera 32a may form images of the packages one after another.

As the drive wheels 30 and 31 are further rotated, the first IC package arrives in the monitor area of the second camera 32b and an image thereof is produced again by the second camera 32b, and after its appropriate processing, it is used for the inspection of the package in outward appearance. This operation is repeated on all the other IC packages arriving one after another until an image of the last IC package is produced by the second camera 32b. The embossed tape 34 is, then, wound completely on the takeup reel 36.

Insofar as the embossed tape 34 is wound about the drive wheels 30 and 31, the cover tape 37 is sufficiently stretched not to become loose and cause any diffused reflection of light when the images of any IC package are produced by the cameras 32a and 32b.

The IC package P in any storage concavity 34b of the embossed tape 34 on the upwardly moving portion U' of the drive wheel 30 is displaced by its own weight toward one of four corners, C1, of the storage concavity 34b with its leads L1 and L2 on two adjacent sides thereof abutting on two adjacent sidewalls W1 and W2, respectively, while a gap G is formed between the leads L3 and L4 on two other adjacent sides of the IC package P and two other adjacent sidewalls W3 and W4, respectively, of the storage concavity 34b, as shown in FIG. 8a.

As a result of further rotation of the drive wheels 30 and 31, however, the IC package P is displaced toward another corner C2 that is diagonally opposite the corner C1, with it leads L3 and L4 abutting on the sidewalls W3 and W4, respectively, while a gap G is formed between the leads L1 and L2 and the sidewalls W1 and W2, respectively, as shown in FIG. 8b.

In either event, the IC package P is not inclined, but maintains its proper position in the storage concavity 34b. The gaps G ensure that, when an image of the IC package P is produced by the camera 32a near the upwardly moving portion U' of the drive wheel 30, no virtual image of any lead L3 or L4 be formed on the sidewall W3 or W4 of the storage concavity 34b, while no virtual image of any lead L1 or L2 is formed on the sidewall W1 or W2, either, when an image of the IC package P is produced by the other camera 32b near the downwardly moving portion D' of the drive wheel 31.

While the invention has been described with reference to the preferred embodiments thereof, variations or modifications may easily be made by anybody of ordinary skill in the art without departing from the scope of this invention which is defined by the appended claims.

What is claimed is:

1. In an apparatus for inspecting the outward appearance of each of IC packages stored in an embossed tape one after another by inspecting its image formed through a cover tape bonded to said embossed tape, the improvement which comprises:

a drive wheel having an outer periphery about which said embossed tape is wound, said drive wheel being rotatable in a vertical plane for moving said embossed tape; and a pair of image forming cameras facing said outer periphery of said drive wheel at its upwardly and downwardly moving portions, respectively.

2. An apparatus as set forth in claim 1, further including a set of guide rollers provided for guiding said embossed tape between a supply reel and said drive wheel, and between said drive wheel and a takeup reel.

3. An apparatus as set forth in claim 1 or 2, wherein said cameras are each mounted at an angle to, and above, a horizontal plane passing through the center of said drive wheel.

4. An apparatus as set forth in claim 3, wherein said angle is in the range of 30 to 60 degrees.

5. In an apparatus for inspecting the outward appearance of each of IC packages stored in an embossed tape one after another by inspecting its images formed through a cover tape bonded to said embossed tape, the improvement which comprises:

a plurality of drive wheels each having an outer periphery about which said embossed tape is wound, said drive wheels being rotatable for moving said embossed tape; and a plurality of image forming cameras so mounted that one of said cameras may face said outer periphery of one of said drive wheels at its upwardly moving portion, while another faces said outer periphery of another of said drive wheels at its downwardly moving portion.

6. An apparatus as set forth in claim 5, wherein said drive wheels are mounted in planes inclined to the vertical in opposite directions.

7. An apparatus as set forth in claim 6, wherein said drive wheels consist of two drive wheels, while said cameras also consist of two cameras, and said embossed tape is movable from said one drive wheel to said other drive wheel.

* * * * *